US012563748B2

(12) United States Patent
Lung

(10) Patent No.: US 12,563,748 B2
(45) Date of Patent: Feb. 24, 2026

(54) 3D BIT COST SCALABLE MEMORY

(71) Applicant: MACRONIX INTERNATIONAL CO., LTD., Hsinchu (TW)

(72) Inventor: Hsiang-Lan Lung, Ardsley, NY (US)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 374 days.

(21) Appl. No.: 18/212,108

(22) Filed: Jun. 20, 2023

(65) Prior Publication Data

US 2024/0431120 A1 Dec. 26, 2024

(51) Int. Cl.
H10B 63/00 (2023.01)

(52) U.S. Cl.
CPC .................................. H10B 63/845 (2023.02)

(58) Field of Classification Search
CPC ........ H10B 63/00; H10B 63/10; H10B 63/80; H10B 63/82; H10B 63/84; H10B 63/845
See application file for complete search history.

(56) References Cited

U.S. PATENT DOCUMENTS

| | | | |
|---|---|---|---|
| 8,415,651 B2 | 4/2013 | Lung | |
| 8,841,649 B2 * | 9/2014 | Pio .......................... | H10B 63/24 |
| | | | 257/E45.001 |
| 9,613,689 B1 * | 4/2017 | Takaki ................... | H01L 23/528 |
| 9,947,721 B2 | 4/2018 | Fantini | |
| 10,461,125 B2 * | 10/2019 | Pirovano ................ | H10B 63/20 |

| | | | |
|---|---|---|---|
| 10,658,588 B2 | 5/2020 | Yasuda et al. | |
| 10,782,891 B1 * | 9/2020 | Martin .................. | G06F 3/0665 |
| 10,796,757 B1 | 10/2020 | Nakazawa | |
| 10,847,578 B1 | 11/2020 | Chen | |
| 11,424,260 B2 | 8/2022 | Lai et al. | |
| 11,871,588 B2 | 1/2024 | Lee et al. | |

(Continued)

FOREIGN PATENT DOCUMENTS

| | | |
|---|---|---|
| JP | 2020516057 A | 5/2020 |
| JP | 2020149736 A | 9/2020 |

(Continued)

OTHER PUBLICATIONS

Jang et al., "Vertical Cell Array Using TCAT (Terabit Cell Array Transistor) Technology for Ultra High Density NAND Flash Memory," 2009 Symp. on VLSI Technology, Jun. 16-18, 2009, 2 pages.

(Continued)

*Primary Examiner* — Eduardo A Rodela

(74) *Attorney, Agent, or Firm* — Korbin S Van Dyke; Haynes Beffel & Wolfeld LLP

(57) ABSTRACT

A 3D bit cost scalable memory device includes a stack of layers and a via electrode extending vertically through the stack of layers. The layers include a controllable conductivity layer and an electrode layer. The electrode layer has a conductor portion and a separator portion that separates the via electrode from the conductor portion of the electrode layer. At least a storage portion of the controllable conductivity layer is in electrical series between the via electrode and the conductor portion of the electrode layer. The via electrode comprises, for example, tungsten (W). The controllable conductivity layer comprises, for example, an ovonic threshold switch material. The conductor portion of the electrode layer comprises, for example, carbon (C).

20 Claims, 11 Drawing Sheets

(56)  References Cited

U.S. PATENT DOCUMENTS

| 2012/0248399 | A1 | 10/2012 | Sasago et al. |
| 2013/0229846 | A1 | 9/2013 | Chien et al. |
| 2014/0291603 | A1 | 10/2014 | Song |
| 2018/0159030 | A1 | 6/2018 | Park |
| 2019/0067371 | A1 | 2/2019 | Pirovano et al. |
| 2019/0172502 | A1* | 6/2019 | Jeong ................. G11C 13/0028 |
| 2020/0052204 | A1 | 2/2020 | Park |
| 2020/0294584 | A1* | 9/2020 | Al-Shamma ........... H10B 63/30 |
| 2021/0249598 | A1 | 8/2021 | Zheng et al. |
| 2022/0235291 | A1 | 7/2022 | Vinther et al. |

FOREIGN PATENT DOCUMENTS

| JP | 2022532863 | A | 7/2022 |
| KR | 1020200028032 | | 3/2020 |
| KR | 1020210087092 | | 7/2021 |
| TW | 201001679 | A | 1/2010 |
| TW | 201737434 | A | 10/2017 |
| TW | 202103302 | A | 1/2021 |
| TW | 202249242 | A | 12/2022 |
| TW | 202308128 | A | 2/2023 |

OTHER PUBLICATIONS

Micheloni et al., "Architectural and Integration Options for 3D NAND Flash Memories," Computers 2017, Aug. 10, 2017, 20 pages.
KR Office Action English Translation from KR Application No. 10-2023-0122720 dated Oct. 10, 2024, 18 pages.
JP Office Action with English Translation from Application No. 2023-135804, dated Oct. 1, 2024, 10 pages.

* cited by examiner

Deposit Thin Films
904

Etch Hole Openings
905

Etch Undercuts
906

Deposit and Etch Back
907

Deposit Via and Perform CMP
908

3D BIT COST SCALABLE MEMORY

BACKGROUND

Field

This disclosure relates to memory cells, including memory cells used in integrated circuits.

Description of Related Art

Memory cells (such as those used in integrated circuits) benefit from improved performance, such as decreased latency, increased bandwidth, and/or reduced power consumption. The memory cells further benefit from improved cost, such as increased density. For example, DRAM scaling is slowing down, resulting in a stall in improvements to performance and/or cost.

SUMMARY

A system of one or more computers are configurable to perform particular operations or actions by virtue of having software, firmware, hardware, or a combination thereof installed on the system that in operation cause the system to perform and/or control the actions. One or more computer programs are configurable to perform particular operations or actions by virtue of including instructions that, when executed by data processing apparatus, cause the apparatus to perform the actions.

A first aspect includes a memory device. The memory device includes a stack of layers, where the layers optionally include a controllable conductivity layer and an electrode layer that is adjacent to the controllable conductivity layer; and a via electrode that extends vertically through the stack, and where the electrode layer optionally includes a conductor portion and a separator portion that separates the via electrode from the conductor portion, and where at least a storage portion of the controllable conductivity layer is in electrical series between the via electrode and the conductor portion.

Variations optionally include one or more of the following features, alone or in any combination. The stack of layers has an internal sidewall that defines a hole to accommodate the via electrode. The controllable conductivity layer includes Ovonic Threshold Switch (OTS) material. The conductor portion optionally includes carbon (C) in combination with a metallic material. The conductor portion optionally includes materials selected from a group of materials that consists of tungsten (W), titanium (Ti), titanium nitride (TiN), tantalum (Ta), cobalt (Co), and ruthenium (Ru). The via electrode optionally includes tungsten (W). The via electrode optionally includes titanium nitride (TiN). The separator portion optionally includes a dielectric material. The via electrode is one of a plurality of via electrodes that each extend vertically through the stack; and the stack has a plurality of internal sidewalls that define holes to accommodate each via electrode of the plurality of via electrodes. The controllable conductivity layer is one of a plurality of controllable conductivity layers; and the electrode layer is one of a plurality of electrode layers, and each controllable conductivity layer of the plurality of controllable conductivity layers is adjacent to a respective one of the plurality of electrode layers. The layers optionally include separating layers; at least one of the separating layers separates each controllable conductivity layer of the plurality of controllable conductivity layers from others of the plurality of controllable conductivity layers; and at least one of the separating layers separates each electrode layer of the plurality of electrode layers from others of the plurality of electrode layers. The conductor portion is one of a plurality of conductor portions; the separator portion is one of a plurality of separator portions; each respective electrode layer of the plurality of electrode layers optionally includes a respective one of the plurality of conductor portions and, corresponding to each via electrode of the plurality of via electrodes, a respective separator portion of the plurality of separator portions; and the separator portions separate the via electrodes from the conductor portions. The storage portion is a particular storage portion; corresponding to each respective via electrode of the plurality of via electrodes and each respective electrode layer of the plurality of electrode layers, at least a respective storage portion of the controllable conductivity layer that is adjacent to the respective electrode layer is in electrical series between the respective via electrode and the conductor portion of the respective electrode layer; and the particular storage portion is one of the respective storage portions. Each conductor portion of the plurality of conductor portions is operable as a respective word line of a memory array; each via electrode of the plurality of via electrodes is operable as a respective bit line of the memory array; and each storage portion is usable as a non-volatile storage to store portions of information of the memory array, the information being resolvable to one or more bits of binary information accessible using the word line and the bit line having the storage portion located therebetween in electrical series. The memory device is suitable to implement non-volatile storage in a Solid State Disk (SSD), to implement Storage Class Memory (SCM), and/or to implement memory compatible with Compute eXpress Link (CXL).

A second aspect includes a method of forming a memory device. The method includes forming a stack of layers, where the layers include a controllable conductivity layer and an electrode layer that is adjacent to the controllable conductivity layer; and forming a via electrode that extends vertically through the stack, and where the electrode layer optionally includes a conductor portion and a separator portion, where the separator portion separates the via electrode from the conductor portion, and where at least a storage portion of the controllable conductivity layer is in electrical series between the via electrode and the conductor portion.

Variations optionally include one or more of the following features, alone or in any combination. The method where the forming of the via electrode optionally includes forming a hole through the stack, and the hole defines dimensions of the via electrode throughout the layers. The electrode layer is formed by forming an undercut in the electrode layer, such that the undercut surrounds the hole, and the undercut defines a volume for the separator portion. The electrode layer is formed by forming the separator portion in the undercut. The controllable conductivity layer optionally includes Ovonic Threshold Switch (OTS) material, and the conductor portion optionally includes carbon (C).

A third aspect includes a processor and a memory enabled to store instructions executable by the processor that when executed by the processor cause the processor to perform operations. The operations include the method of forming a memory device.

Variations of the foregoing aspects optionally include hardware, a method or process, or computer software on a computer-accessible medium.

Other aspects and advantages of this disclosure are apparent from the drawings, the detailed description, and the claims.

DETAILED DESCRIPTION

Figure 1A:
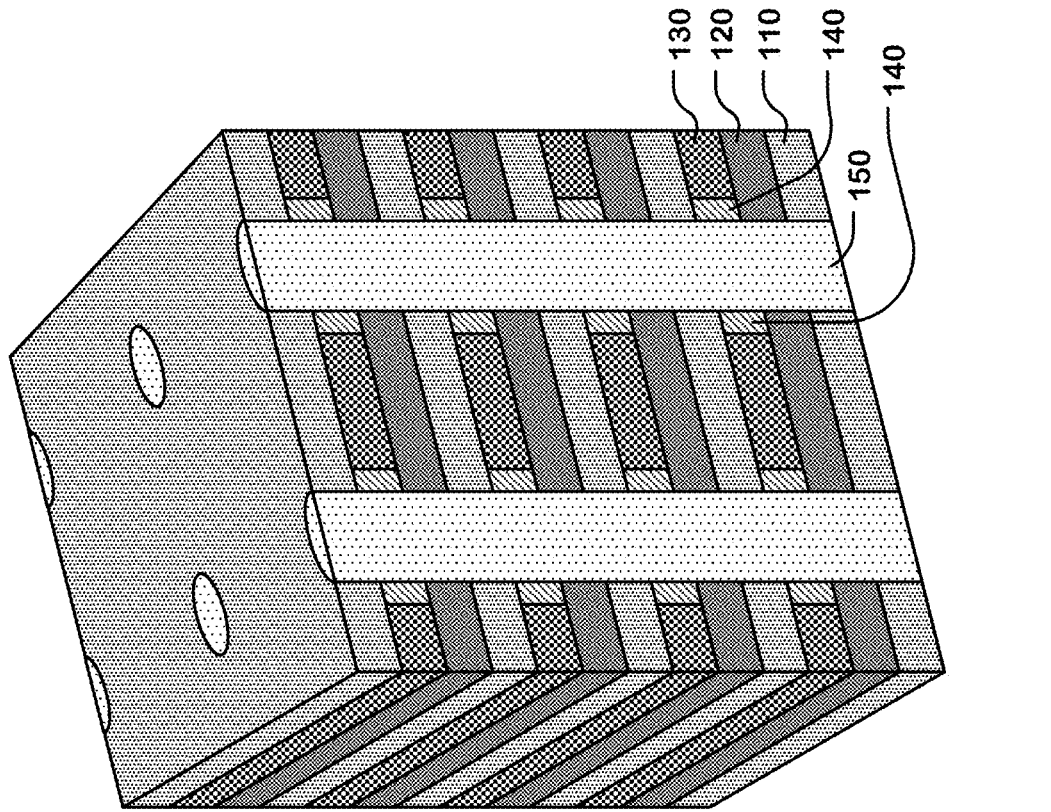
FIGS. 1A, 1B, and 1C respectively illustrate a 3D view, a cross section view, and a top view of various aspects of memory cells of a 3D bit cost scalable memory.

A detailed description of techniques relating to 3D bit cost scalable memory are provided with reference to FIGS. 1A-1C and FIGS. 2-9.

One or more flow diagrams are described herein. Processing described by the flow diagrams is implementable and/or directable using processors programmed using computer programs stored in memory accessible to computer systems and executable by the processors, using dedicated logic hardware (including field programmable integrated circuits), and using various combinations thereof. Various actions are combinable, performable in parallel, and/or performable in a different sequence without affecting processing achieved. In some cases, a rearrangement of actions achieves identical results only if certain other changes are made as well. In other cases, a rearrangement of actions achieves identical results only if certain conditions are satisfied. Furthermore, for clarity, some of the flow diagrams herein omit certain some actions not necessary for understanding the disclosed techniques. Various additional actions are performable before, after, and/or between the illustrated actions.

Examples of selected acronyms, mnemonics, and abbreviations used in the description are as follows.

| Acronym/Mnemonic/<br>Abbreviation | Example |
|---|---|
| ALD | Atomic Layer Deposition |
| CMP | Chemical Metal Polishing |
| CPU | Central Processing Unit |
| CVD | Chemical Vapor Deposition |
| CXL | Compute eXpress Link |
| DIMM | Dual Inline Memory Module |
| DRAM | Dynamic read/write Random Access Memory |
| GPU | Graphics Processing Unit |
| NAND | Not AND, e.g., series connection of devices |
| NVDIMM | Non-Volatile Dual Inline Memory Module |
| OTS | Ovonic Threshold Switch |
| RIE | Reactive Ion Etching |
| SCM | Storage Class Memory |
| SiNx | Silicon Nitride, e.g., SiN or $Si_3N_4$ |
| SiOx | Silicon Oxide, e.g., SiO, $SiO_2$, and/or non-stoichiometric $SiO_x$ |
| SODIMM | Small Outline Dual Inline Memory Module |
| SSD | Solid State Drive |

3D Bit Cost Scalable Memory Concepts 3D bit cost scalable memory as described herein comprises structures to form non-volatile memory cells. The memory cells are enabled to store information, such as one or more bits of information per memory cell. The memory cells are formed at intersections of vertical bit lines and horizontal word planes, and information storage is provided at the intersections. Each memory cell is formed by a pair of active layers. A separating layer separates the memory cells in the vertical dimension.

The word line planes are formed from thin film layers deposited on a planar wafer surface. The vertical bit lines are orthogonal to the planar wafer surface.

Integrated circuit fabrication techniques, such as those based on planar processing of a silicon wafer, are usable to produce electronic devices comprising one or more 3D bit cost scalable memories as described herein.

Some 3D bit cost scalable memories as described herein enable access latency competitive with DRAM (e.g., faster than 3D NAND-based memories) while also enabling density competitive with 3D NAND-based memories (e.g., denser than DRAM). Some 3D bit cost scalable memories as described herein enable cost reduction of memory fabrication compared to other memory fabrication techniques.

Figure 5:
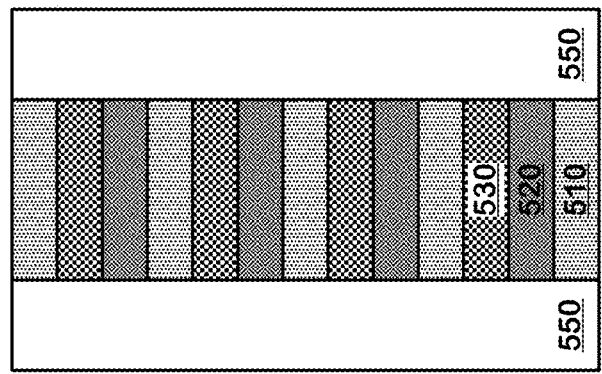

Throughout the description herein, as well as the associated figures, like-numbered elements correspond to identical elements, substantially similar elements, and/or instances thereof. For example, Via Electrode 150 of FIG. 1A is identical to Via Electrode 150 of FIG. 1B. For another example, Completed Separator Layer 510 of FIG. 5 is identical to Completed Separator Layer 510 of FIG. 6.

Figure 4:
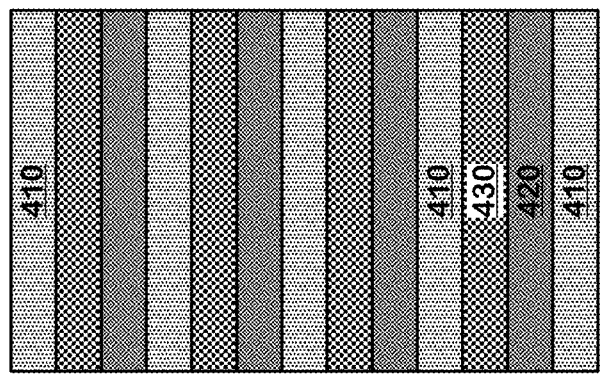
FIGS. 4, 5, 6, 7, and 8 illustrate time-sequence snapshots of an example of fabrication of a 3D bit cost scalable memory.

Throughout the figures, unless indicated otherwise, like-stippled elements correspond to elements comprised of identical or substantial identical types of materials, such as identical or substantially similar chemical compositions and/or structures. For example, stippling of Controllable Conductivity Layer 420 of FIG. 4 is identical to that of Completed Controllable Conductivity Layer 520 of FIG. 5, indicating that Controllable Conductivity Layer 420 and Completed Controllable Conductivity Layer 520 are of substantially similar materials, such as an OTS material.

Figure 1B:
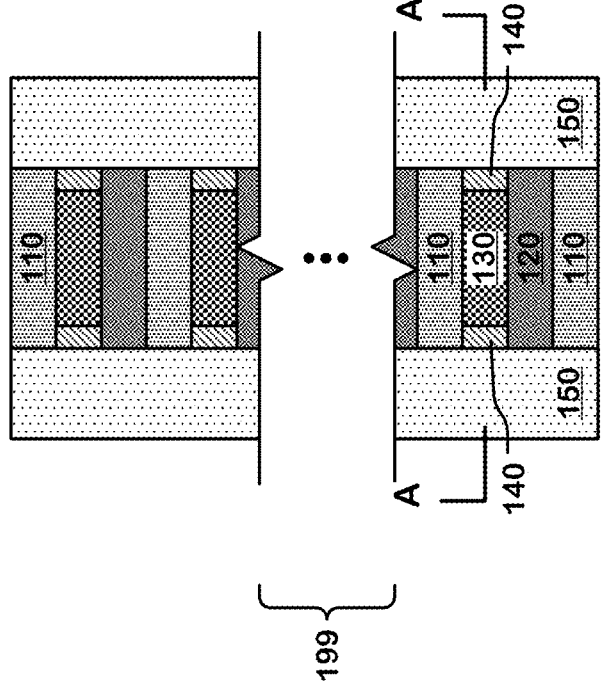
Figure 1C:
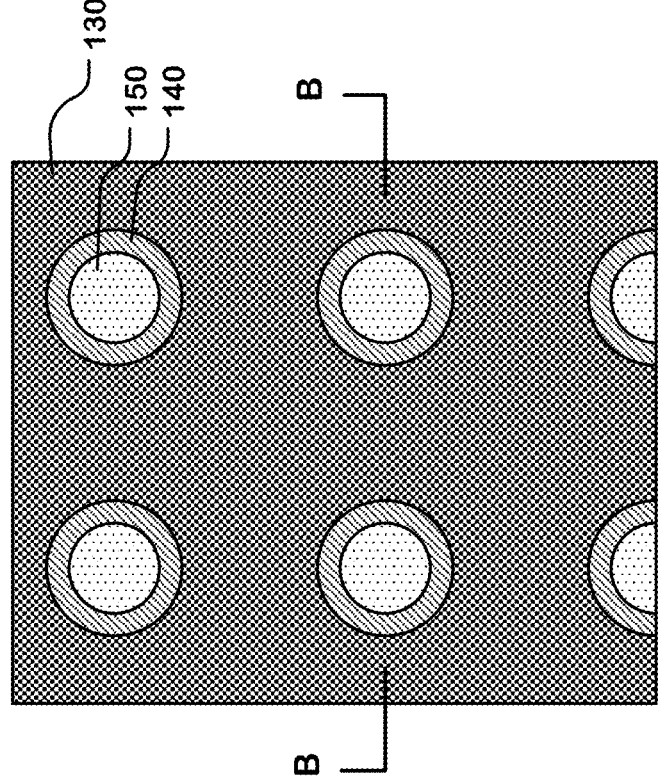

FIGS. 1A-1C illustrate various aspects of memory cells of a 3D bit cost scalable memory. FIG. 1A illustrates a 3D view of a portion of a 3D bit cost scalable memory. There are six instances of Via Electrode 150. There are five instances of Separator Layer 110, four instances of Controllable Conductivity Layer 120, and four instances of an Electrode Layer that includes an Electrode Conductor Portion 130 and a Separator Portion 140. At each intersection of instances of Via Electrode 150 and Electrode Conductor Portion 130 there is an instance of Separator Portion 140.

FIG. 1B illustrates a side view of a portion of a 3D bit cost scalable memory. The view corresponds to cross section B-B of FIG. 1C. Upper and lower layers of the stack are instances of Separator Layer 110. Each respective instance of Controllable Conductivity Layer 120 is adjacent to a corresponding layer that comprises an instance of Electrode Conductor Portion 130 and an instance of Separator Portion 140. Each instance of Separator Portion 140 surrounds a portion of one of the instances of Via Electrode 150. Instances of Separator Layer 110 form top and bottom layers, and further instances of Separator Layer 110 form separators between Controllable Conductivity Layer 120 and the layer formed from Electrode Conductor Portion 130 in combination with Separator Portion 140. Bracket 199 indicates that an arbitrary number of repetitions of the three-layer stacking of (1) Controllable Conductivity Layer 120, (2) the electrode layer formed from Electrode Conductor Portion 130 in combination with Separator Portion 140, and (3) Separator Layer 110 is possible. Information storage is respectively provided, for example, by (storage) portions of instances of Controllable Conductivity Layer 120 that are in electrical series between instances of Via Electrode 150 and instances of Electrode Conductor Portion 130.

FIG. 1C illustrates a top view of a portion of a 3D bit cost scalable memory. The view corresponds to cross section A-A of FIG. 1B. Instances of Via Electrode 150, surrounded by instances of Separator Portion 140, are disposed in an instance of Electrode Conductor Portion 130.

Figure 2:
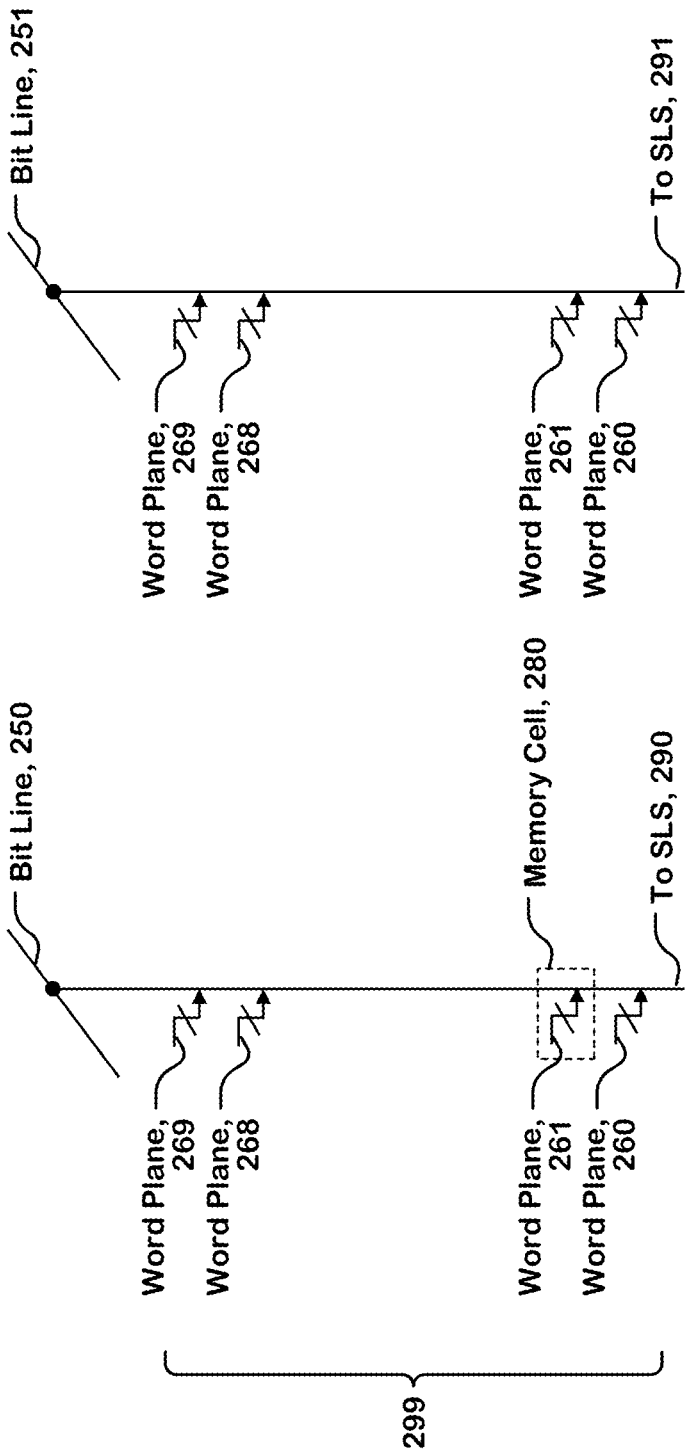
FIG. 2 illustrates a schematic of various aspects of memory cells of a 3D bit cost scalable memory.

FIG. 2 illustrates a schematic of various aspects of memory cells of a 3D bit cost scalable memory. For clarity, structure associated with two bit lines (Bit Lines 250 and 251) is illustrated. Bit Line 250 is coupled in parallel to a plurality of memory cells. An example memory cell is illustrated as Memory Cell 280. Bit Line 250 is coupled to a source line selector (not illustrated) via To Source Line Selector (SLS) 290. Bit Line 251 is coupled to a source line selector (not illustrated) via To Source Line Selector (SLS) 291. The number of memory cells implemented is arbitrary, as indicated by Bracket 299. Bracket 299 conceptually corresponds to Bracket 199 of FIG. 1B.

Memory Cell 280 is implemented, for example, by elements of FIG. 1B, such as the two-layer stacking of (1) Controllable Conductivity Layer 120 and (2) the electrode layer formed from Electrode Conductor Portion 130 in combination with Separator Portion 140. As a specific example, Memory Cell 280 is implemented by the portion of an instance of Controllable Conductivity Layer 120 that is in electrical series between an instance of Via Electrode 150 and an instance of Electrode Conductor Portion 130.

A word plane is associated with each memory cell. The word planes are illustrated as Word Planes 260, 261, 268, and 269. Each word plane corresponds to an instance of Electrode Conductor Portion 130 of FIG. 1B. Each word plane is associated with a plurality of bit lines, as illustrated by, e.g., Word Plane 260 coupling to memory cells of Bit Lines 250 and 251. Each of Bit Lines 250 and 251 corresponds to an instance of Via Electrode 150 of FIG. 1B.

Bracket 299 indicates that an arbitrary number of repetitions of the three-layer stacking of (1) Controllable Conductivity Layer 120, (2) the electrode layer formed from Electrode Conductor Portion 130 in combination with Separator Portion 140, and (3) Separator Layer 110 is possible.

Figure 3:
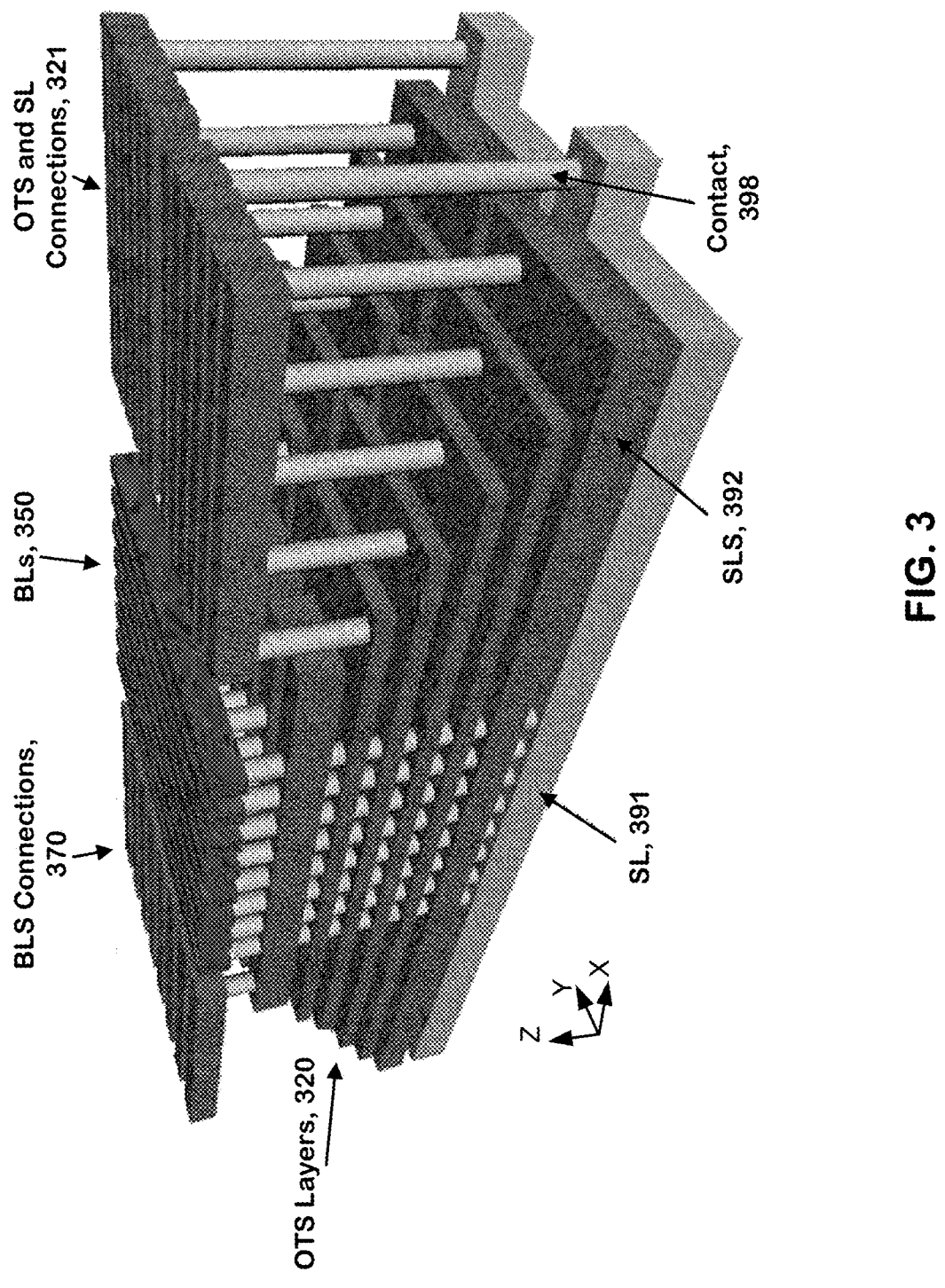
FIG. 3 illustrates a 3D view of various aspects of a memory array of a 3D bit cost scalable memory.

FIG. 3 illustrates a 3D view of various aspects of a memory array of a 3D bit cost scalable memory. Bit Lines (BLs) 350 are example implementations of Via Electrode 150 of FIG. 1B and, e.g., instances of Bit Line 250 of FIG. 2. Bit Line Selector (BLS) Connections 370 is an implementation of a plurality of connections for Bit Lines (BLs) 350. OTS Layers 320 is an example implementation of a plurality of Controllable Conductivity Layers 120 of FIG. 1B. Source Line Selector (SLS) 392 is an example of a source line selector that, e.g., couples to To Source Line Selector (SLS) 290 of FIG. 2. Source Line (SL) 391 is coupled to Source Line Selector (SLS) 392. OTS and SL Connections 321 is an example of a plurality of connections to other elements (e.g., drivers, not illustrated). Contact 398 is an example of a contact between Source Line (SL) 391 and another element (e.g., a source of ground, not illustrated).

3D Bit Cost Scalable Memory Example Fabrication

FIGS. 4-8 illustrate time-sequence snapshots of an example of fabrication of a 3D bit cost scalable memory. The time-sequence proceeds monotonically in time, beginning with FIG. 4 and ending with FIG. 8. Each of the snapshots is a cross section view.

FIG. 4 illustrates a first of the time sequence snapshots. Fabrication processing equipment performs thin film depositions of three alternating planar layers of materials. Two of the layers are a pair of active layers. One of the layers is a separator layer. A first layer of the pair of active layers is represented by Controllable Conductivity Layer 420. A second layer of the pair of active layers is represented by Electrode Conductor Layer 430. The separator layer is represented by Separator Layer 410. The separator layer separates each pair of active layers from others of the pairs of active layers.

The thin film depositions begin with the fabrication processing equipment depositing a first (e.g., base) layer as Separator Layer 410, such as on a top portion of a substrate, for example a top portion of a silicon-base wafer. The thin film depositions continue with the fabrication processing equipment depositing a second layer as Controllable Conductivity Layer 420. Thus, Controllable Conductivity Layer 420 is adjacent to and coplanar with Separator Layer 410. The thin film depositions continue with the fabrication processing equipment depositing a third layer as Electrode Conductor Layer 430. Thus, Electrode Conductor Layer 430 is adjacent to and coplanar with Controllable Conductivity Layer 420.

The thin film depositions continue with the fabrication processing equipment depositing further instances of Separator Layer 410, Controllable Conductivity Layer 420, and Electrode Conductor Layer 430, until a predetermined number of layers are deposited. In various example 3D bit cost scalable memories, there are various numbers of instances of layers, such as 300 layers (e.g., 200 pairs of active layers and 100 separator layers) or such as 3000 layers.

After the thin film depositions, the fabrication processing equipment performs further processing on the layers of materials to form a plurality of 3D bit cost scalable memory cells (as illustrated in FIGS. 4-8).

In some example fabrications of a 3D bit cost scalable memory, the first instance of Separator Layer 410 is omitted, and the first instance of Controllable Conductivity Layer 420 is deposited directly on a substrate. As illustrated, the last layer deposited is an instance of Separator Layer 410. Alternatively, the last layer deposited is variously an instance of Controllable Conductivity Layer 420 or an instance of Electrode Conductor Layer 430.

In various fabrication examples, materials used and/or thicknesses thereof are variously (a) identical for all instances of Separator Layer 410, (b) identical for all except the first instance of Separator Layer 410, (c) identical for all except the last instance of Separator Layer 410, or (d) identical for all except the first and last instances of Separator Layer 410.

Figure 9:
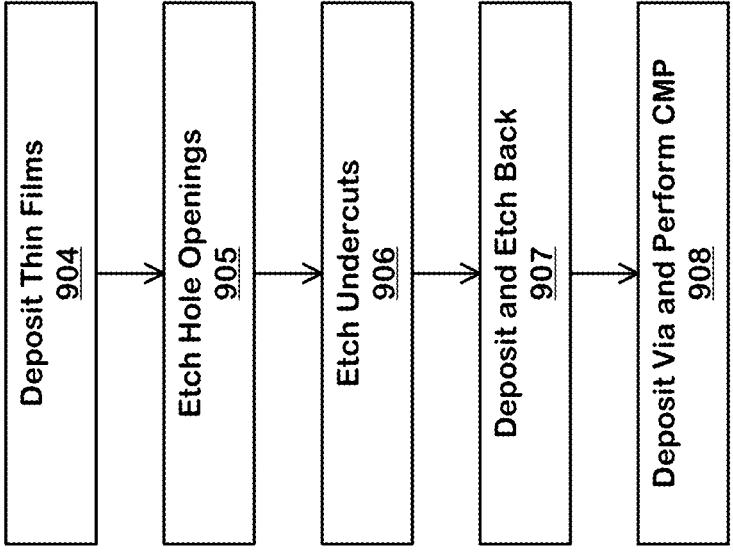
FIG. 9 illustrates a flow diagram for a technique to fabricate one or more regions of 3D bit cost scalable memory.

Refer to Deposit Thin Films 904 of FIG. 9 and associated descriptive paragraphs for additional description relating to FIG. 4.

FIG. 5 illustrates a second of the time sequence snapshots. Fabrication processing equipment performs etching to form parallel holes orthogonal to the planar layers of materials. The holes extend through the layers. Each hole establishes a respective internal sidewall that extends through the layers. The holes are represented by respective instances of Hole 550 (for Via Electrode 850). Etching of instances of Hole 550 transforms instances of Separator Layer 410, Controllable Conductivity Layer 420, and Electrode Conductor Layer 430, as illustrated in FIG. 4, respectively into instances of Completed Separator Layer 510, Completed Controllable Conductivity Layer 520, and Electrode Conductor Layer 530, as illustrated in FIG. 5. In some variations, the holes extend through all the layers except the first instance of Separator Layer 410. In some variations, the holes extend through all the layers including the first instance of Separator Layer 410.

Refer to Etch Hole Openings 905 of FIG. 9 and associated descriptive paragraphs for additional description relating to FIG. 5.

Figure 6:
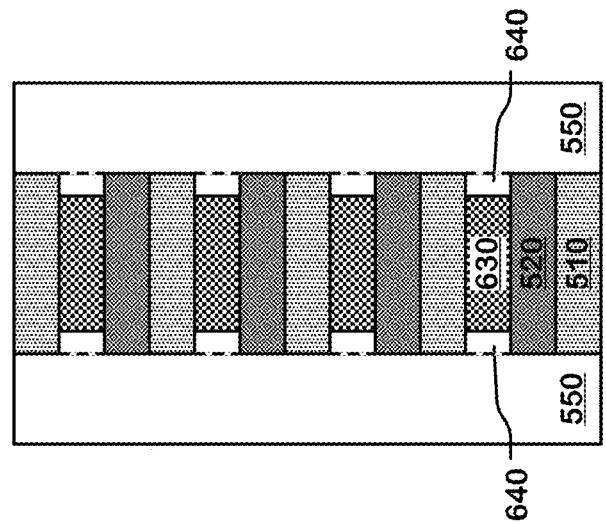

FIG. 6 illustrates a third of the time sequence snapshots. Fabrication processing equipment performs etching to form undercuts in instances of Electrode Conductor Layer 530 to form instances of Completed Electrode Conductor Portion 630 and corresponding instances of Electrode Separator Undercut 640. There is an instance of Electrode Separator Undercut 640 for each instance of Hole 550 in each instance of Electrode Conductor Layer 530. At this stage of fabrication, instances of Hole 550 and instances of Electrode Separator Undercut 640 are conceptual. They are conceptual in the sense that for each instance of Hole 550, the instances of Electrode Separator Undercut 640 that are adjacent thereto collectively with the respective instance of Hole 550, form a single 3D void. In the figure, adjacency of instances of Hole 550 and Electrode Separator Undercut 640 are illustrated by dashed lines.

As one specific example, in a context of a circular Hole 550, each instance of Electrode Separator Undercut 640 is a ring-shaped volume of material additionally removed from Electrode Conductor Layer 530 to form Completed Electrode Conductor Portion 630.

Instances of Hole 550, Completed Separator Layer 510, and Completed Controllable Conductivity Layer 520 are unaffected by the undercut etching.

Refer to Etch Undercuts 906 of FIG. 9 and associated descriptive paragraphs for additional description relating to FIG. 6.

Figure 7:
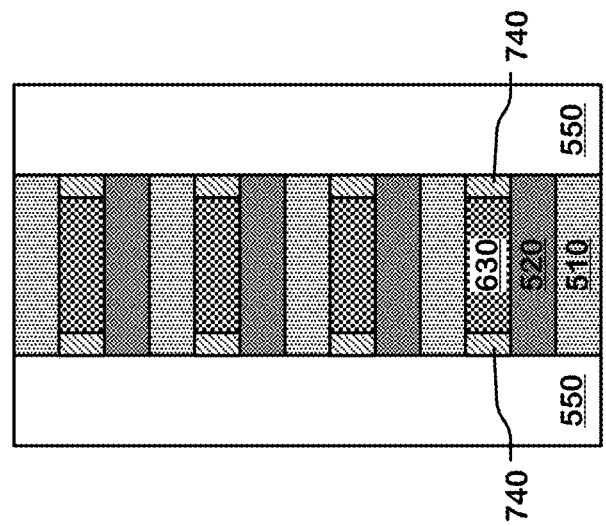

FIG. 7 illustrates a fourth of the time sequence snapshots. Fabrication processing equipment performs deposition of separator material into the instances of Electrode Separator Undercut 640 and Hole 550, and then etches back the separator material to form instances of Completed Separator Portion 740. Thus, after the separator material deposition, the respective internal sidewalls established by the hole opening etching (e.g., as illustrated and described with respect to FIG. 5) are effectively restored.

Instances of Completed Electrode Conductor Portion 630, Hole 550, Completed Separator Layer 510, and Completed Controllable Conductivity Layer 520 are unaffected by the deposition of the separator material.

Refer to Deposit and Etch Back 907 of FIG. 9 and associated descriptive paragraphs for additional description relating to FIG. 7.

Figure 8:
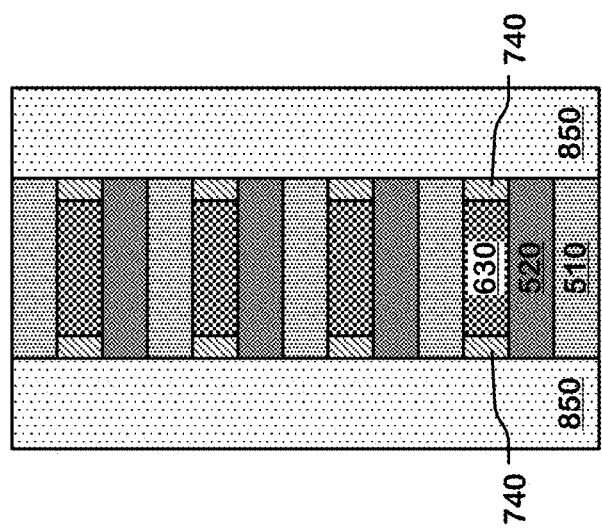

FIG. 8 illustrates a fifth of the time sequence snapshots. Fabrication processing equipment performs deposition (e.g., via metal deposition) of via electrode material to (entirely) fill the instances of Hole 550, and then performs CMP to form instances of Via Electrode 850.

Instances of Completed Separator Layer 510, Completed Controllable Conductivity Layer 520, Completed Electrode Conductor Portion 630, and Completed Separator Portion 740 are unaffected by the deposition of the via electrode material.

Thus, FIG. 8 depicts a completed portion of a 3D bit cost scalable memory. FIGS. 4-8 represent an example of fabricating 3D bit cost scalable memory as illustrated in FIGS. 1A-1C. Instances of Completed Separator Layer 510, Completed Controllable Conductivity Layer 520, Completed Electrode Conductor Portion 630, Completed Separator Portion 740, and Via Electrode 850 of FIG. 8 correspond respectively to instances of Separator Layer 110, Controllable Conductivity Layer 120, Electrode Conductor Portion 130, Separator Portion 140, and Via Electrode 150 of FIGS. 1A-1C.

Refer to Deposit Via and Perform CMP 908 of FIG. 9 and associated descriptive paragraphs for additional description relating to FIG. 8.

3D Bit Cost Scalable Memory Example Fabrication Flow

Devices comprising 3D bit cost scalable memory are manufactured, for example, from a wafer, such as a semiconductor (e.g., silicon) wafer. The wafer has a top surface compatible with fabrication via processing across the entirety of the top surface of the wafer. The fabrication is performable in a semiconductor fabrication facility. The processing forms one or more regions of 3D bit cost scalable memory elements and optionally forms other regions. The other regions optionally comprise circuitry to use the 3D bit cost scalable memory elements as a memory device, such as one or more processors, interfaces, and/or circuitry enabled to interoperate with memories. The other regions optionally comprise circuitry to use a 3D bit cost scalable memory device in a system and/or elements of the system itself.

FIG. 9 illustrates a flow diagram for a technique to fabricate one or more regions of 3D bit cost scalable memory elements, such as illustrated in any of the preceding figures.

The operations comprise deposition and etching of materials to form the 3D bit cost scalable memory. The etching is guided, for example, by use of one or more masks, such as a photomask. The etching optionally comprises intermediate actions of depositing a layer of photo-sensitive material that is selectively removed (or retained) based on selective exposure of the photo-sensitive material to electromagnetic radiation (e.g., ultraviolet light) via the photomask. Different photomasks are used for different actions illustrated in the figure. For clarity, in the following description relating to the figure, specific mentions of photomasks are omitted.

The fabrication processing equipment begins by depositing a plurality of three alternating planar thin film layers (Deposit Thin Films 904) such as instances of Separator Layer 410, Controllable Conductivity Layer 420, and Electrode Conductor Layer 430 of FIG. 4. The thin film layers alternate such that a pair of active layers is formed followed by a separating layer that separates a subsequently formed pair of active layers, and so forth, until a target number of layers are formed.

The first deposition (e.g., a first instance of Separator Layer 410) covers at least substantially the entirety of the regions of the top surface of the wafer that are to become vertical 3D bit cost scalable memory elements. The second deposition (e.g., Controllable Conductivity Layer 420 adjacent to Separator Layer 410) covers at least substantially the entirety of the top surface of the first deposition. The third deposition (e.g., Electrode Conductor Layer 430 adjacent to Controllable Conductivity Layer 420) covers at least substantially the entirety of the top surface of the second deposition, and so forth. Separating layers (corresponding to the first deposition, fourth deposition, and so forth) serve to separate (e.g., electrically and/or thermally) the pairs of active layers from others of the pairs of active layers. The separating layers (e.g., Separator Layer 410) are optionally comprised of a same material, e.g., a particular dielectric, such as Silicon Nitride or Silicon Oxide. The pairs of active layers (corresponding to the second and third depositions, fifth and sixth fourth deposition, and so forth) serve to form a portion of active circuitry of the 3D bit cost scalable memory elements. A first of the pair of active layers (e.g., Controllable Conductivity Layer 420) comprises a controllable conductivity material, such as a particular OTS material. A second of the pair of active layers (e.g., Electrode Conductor Layer 430) comprises a conductive material, such as a material comprising carbon (C). Depositions continue until a target number of layers are deposited, e.g., 3*8, 3*32, 3*64, 3*1024 total layers (corresponding to 8, 32, 64, and 1024 pairs of active layers) are formed.

The thin film depositions are performable using CVD.

Then the fabrication processing equipment forms holes for subsequent deposition of material to form (deep) via electrodes (Etch Hole Openings 905) such as instances of Hole 550 of FIG. 5. The holes are for subsequent deposition of material for center electrodes. The hole forming is performable via etching, e.g., by using RIE techniques. In some variations, an etching stop layer is used to determine the depth of the hole etching, e.g., to prevent etching too deeply.

Then the fabrication processing equipment forms conductor portions (of the electrode conductor layers), such as illustrated by Completed Electrode Conductor Portion 630 of FIG. 6. The forming is by etching an undercut in each of the electrode conductor layers (Etch Undercuts 906), such as illustrated by Electrode Separator Undercut 640 of FIG. 6.

The undercut etching is performable using wet or dry etching techniques. One example etching technique is $O_2$ plasma etching. Another example etching technique is $N_2$ plasma etching. Undercut extension is controllable by controlling etch time.

Then the fabrication processing equipment forms separator portions (of the electrode conductor layers), such as illustrated by Completed Separator Portion 740 of FIG. 7. The forming is by material depositing and then etching (Deposit and Etch Back 907). The material depositing fills undercuts as well as the holes with separator material. Then the etching removes (e.g., cuts back) the separator material to reform the holes as first formed, such as in Etch Hole Openings 905 (e.g., as illustrated by Completed Separator Portion 740 of FIG. 7).

The material depositing is performable via ALD techniques. In some variations, the etching is performable via RIE techniques.

Then the fabrication processing equipment forms the (deep) via electrodes. The forming is by material depositing and then polishing (Deposit Via and Perform CMP 908). The material depositing fills, with via electrode material, the holes first formed in Etch Hole Openings 905 and then re-formed in Deposit and Etch Back 907. The polishing removes material, e.g., so that the uppermost separator layer is exposed.

The material depositing is performable via CVD techniques. The polishing is performable via CMP techniques.

Thus, the processing for fabricating the 3D bit cost scalable memory elements is complete.

In some fabrication flows, additional processing precedes, follows, and/or is wholly or partially concurrent with any one or more of the actions illustrated in FIG. 9. For example, the additional processing is for circuitry related to using the 3D bit cost scalable memory elements as a memory device, using the memory device in a system, and/or forming one or more components of the system.

3D Bit Cost Scalable Memory Materials

Suitable materials for (deep) via electrodes comprise one or more conductive materials such as tungsten (W) and titanium nitride (TiN) singly, in any combination with each other, or serving as a basis of a material formulated in combination with one or more other materials.

Suitable materials for conductor portions of electrode layers comprise one or more conductive materials such as carbon (C), tungsten (W), titanium (Ti), titanium nitride (TIN), tantalum (Ta), cobalt (Co), and ruthenium (Ru) singly, in any combination with each other, or serving as a basis of a material formulated in combination with one or more other materials. Some conductor portions comprise carbon (C) in combination with a metallic material, such as tungsten (W), titanium (Ti), tantalum (Ta), cobalt (Co), and ruthenium (Ru).

Suitable materials for controllable conductivity materials include arsenic (As), selenium (Se), silicon (Si), germanium (Ge), antimony (Sb), tellurium (Te), and indium (In) singly, in any combination with each other, or serving as a basis of a material formulated in combination with one or more other materials. For various examples, one or more of the OTS elements are fabricated from a chalcogenide comprising (i) As, Se, and Ge (e.g., AsSeGe), (ii) AsSeGe and Si (e.g., AsSeGeSi), (iii) AsSeGeSi and In (e.g., AsSeGeSiIn), and (iv) AsSeGeIn.

Suitable materials for separating layers and/or for separator portions of electrode layers comprise one or more dielectric materials such as Silicon Nitride or Silicon Oxide.

3D Bit Cost Scalable Memory Devices and Systems

Some devices (e.g., integrated circuits, one or more die of a system-on-a-chip, and/or packaged die) comprise one or more arrays of 3D bit cost scalable memory cells (as described elsewhere herein) with additional circuitry to implement a memory device usable as a stand-alone device and/or usable as a component in a system. The additional circuitry provides interface and control functions to enable the 3D bit cost scalable memory cell arrays to appear variously organized as one or more planes, each plane comprising one or more blocks, each block comprising one or more pages.

The additional circuitry variously comprises hardware circuitry blocks such as bit line circuitry, sense amplifiers, page caches/buffers, interface circuitry, word line decoders/drivers, controllers, and/or bias circuitry (such as voltage and/or current sources).

In some variations, the additional circuitry enables arrays of 3D bit cost scalable memory cells to be used as a replacement and/or augmentation of DRAM and/or SCM in a system, such as packaged in a DIMM or SODIMM. In some variations, the additional circuitry enables coupling arrays of 3D bit cost scalable memory cells to CPUs and/or GPUs via high-performance communication technologies such as CXL. In some variations, the additional circuitry enables using arrays of 3D bit cost scalable memory cells in one or more portions of a memory and/or storage hierarchy, such as in an SSD and/or in DRAM-like components.

In some variations, the additional circuitry enables arrays of 3D bit cost scalable memory cells to be used as a replacement and/or augmentation of various non-volatile memory elements in a system, such as packaged in and/or operated as an NVDIMM.

3D Bit Cost Scalable Memory Additional Information

FIGS. 1A-1C and FIGS. 2-9 disclose various aspects of example 3D bit cost scalable memory techniques that provide non-volatile information storage by using a controlled conductivity layer such as comprised of an OTS material.

While the present invention is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the invention and the scope of the following claims.

What is claimed is:

1. A memory device comprising:
a stack of layers, wherein the layers comprise a controllable conductivity layer and an electrode layer that is directly adjacent to the controllable conductivity layer; and
a via electrode that extends vertically through the stack, and
wherein the electrode layer comprises a conductor portion and a separator portion that separates the via electrode from the conductor portion, and
wherein at least a storage portion of the controllable conductivity layer is in electrical series between the via electrode and the conductor portion.

2. The memory device of claim 1, wherein the stack of layers has an internal sidewall that defines a hole to accommodate the via electrode.

3. The memory device of claim 1, wherein the controllable conductivity layer comprises Ovonic Threshold Switch (OTS) material.

4. The memory device of claim 1, wherein the conductor portion comprises carbon (C) in combination with a metallic material.

5. The memory device of claim 1, wherein the conductor portion comprises materials selected from a group of materials consisting of tungsten (W), titanium (Ti), titanium nitride (TiN), tantalum (Ta), cobalt (Co), and ruthenium (Ru).

6. The memory device of claim 1, wherein the via electrode comprises tungsten (W).

7. The memory device of claim 1, wherein the via electrode comprises titanium nitride (TiN).

8. The memory device of claim 1, wherein the separator portion comprises a dielectric material.

9. The memory device of claim 1, wherein:
the via electrode is one of a plurality of via electrodes that each extend vertically through the stack; and
the stack has a plurality of internal sidewalls that define holes to accommodate each via electrode of the plurality of via electrodes.

10. The memory device of claim 9, wherein:
the controllable conductivity layer is one of a plurality of controllable conductivity layers; and
the electrode layer is one of a plurality of electrode layers, and each controllable conductivity layer of the plurality of controllable conductivity layers is adjacent to a respective one of the plurality of electrode layers.

11. The memory device of claim 10, wherein:
the layers further comprise separating layers;
at least one of the separating layers separates each controllable conductivity layer of the plurality of controllable conductivity layers from others of the plurality of controllable conductivity layers; and
at least one of the separating layers separates each electrode layer of the plurality of electrode layers from others of the plurality of electrode layers.

12. The memory device of claim 10, wherein:
the conductor portion is one of a plurality of conductor portions;
the separator portion is one of a plurality of separator portions;

each respective electrode layer of the plurality of electrode layers comprises a respective one of the plurality of conductor portions and, corresponding to each via electrode of the plurality of via electrodes, a respective separator portion of the plurality of separator portions; and
the separator portions separate the via electrodes from the conductor portions.

13. The memory device of claim 12, wherein:
the storage portion is a particular storage portion;
corresponding to each respective via electrode of the plurality of via electrodes and each respective electrode layer of the plurality of electrode layers, at least a respective storage portion of the controllable conductivity layer that is adjacent to the respective electrode layer is in electrical series between the respective via electrode and the conductor portion of the respective electrode layer; and
the particular storage portion is one of the respective storage portions.

14. The memory device of claim 13, wherein:
each conductor portion of the plurality of conductor portions is operable as a respective word line of a memory array;
each via electrode of the plurality of via electrodes is operable as a respective bit line of the memory array; and
each storage portion is usable as a non-volatile storage to store portions of information of the memory array, the information being resolvable to one or more bits of binary information accessible using the word line and the bit line having the storage portion located therebetween in electrical series.

15. The memory device of claim 14, wherein the memory device is suitable to implement non-volatile storage in a Solid State Disk (SSD), to implement Storage Class Memory (SCM), and/or to implement memory compatible with Compute eXpress Link (CXL).

16. A method of forming a memory device, the method comprising:
forming a stack of layers, wherein the layers comprise a controllable conductivity layer and an electrode layer that is adjacent to the controllable conductivity layer; and
forming a via electrode that extends vertically through the stack and that is directly adjacent to the controllable conductivity layer, and
wherein the electrode layer comprises a conductor portion and a separator portion,
wherein the separator portion separates the via electrode from the conductor portion, and
wherein at least a storage portion of the controllable conductivity layer is in electrical series between the via electrode and the conductor portion.

17. The method of claim 16, wherein the forming of the via electrode comprises forming a hole through the stack, and the hole defines dimensions of the via electrode throughout the layers.

18. The method of claim 17, wherein the electrode layer is formed by forming an undercut in the electrode layer, such that the undercut surrounds the hole, and the undercut defines a volume for the separator portion.

19. The method of claim 18, wherein the electrode layer is formed by forming the separator portion in the undercut.

20. The method of claim 16, wherein the controllable conductivity layer comprises Ovonic Threshold Switch (OTS) material, and wherein the conductor portion comprises carbon (C).

* * * * *